(12) United States Patent
Liu et al.

(10) Patent No.: US 11,476,301 B2
(45) Date of Patent: Oct. 18, 2022

(54) DISPLAY APPARATUS AND MANUFACTURING METHOD THEREOF

(71) Applicant: Au Optronics Corporation, Hsinchu (TW)

(72) Inventors: Chan-Jui Liu, Hsinchu (TW); Chen-Chi Lin, Hsinchu (TW); Chun-Cheng Cheng, Hsinchu (TW)

(73) Assignee: AU OPTRONICS CORPORATION, Hsinchu (TW)

( * ) Notice: Subject to any disclaimer, the term of this patent is extended or adjusted under 35 U.S.C. 154(b) by 118 days.

(21) Appl. No.: 17/105,410

(22) Filed: Nov. 25, 2020

(65) Prior Publication Data

US 2021/0217807 A1 Jul. 15, 2021

Related U.S. Application Data

(60) Provisional application No. 62/960,846, filed on Jan. 14, 2020.

(30) Foreign Application Priority Data

Jul. 1, 2020 (TW) .................................. 109122232

(51) Int. Cl.
*H01L 27/15* (2006.01)
*H01L 33/62* (2010.01)
(Continued)

(52) U.S. Cl.
CPC .......... *H01L 27/156* (2013.01); *G09G 3/006* (2013.01); *H01L 33/005* (2013.01); *H01L 33/62* (2013.01); *H01L 2933/0066* (2013.01)

(58) Field of Classification Search
CPC ..... H01L 27/156; H01L 33/005; H01L 33/62; H01L 2933/0066; H01L 25/167;
(Continued)

(56) References Cited

U.S. PATENT DOCUMENTS 9,786,646 B2 10/2017 Cok et al.
9,858,877 B2 * 1/2018 Pan .......................... G09G 3/006
(Continued)

FOREIGN PATENT DOCUMENTS

CN 106054416 10/2016
CN 110459578 11/2019
CN 110568678 12/2019

*Primary Examiner* — Victor A Mandala
(74) *Attorney, Agent, or Firm* — JCIPRNET

(57) ABSTRACT

A display apparatus, including a substrate, a conductive structure, a pixel unit, a signal line, a transmission line, and a repair structure, is provided. The substrate has a first surface, a second surface, and a through hole. The conductive structure is disposed in the through hole. The pixel unit is disposed on the first surface. The pixel unit includes first, second, third, and fourth connection pads, a driving element, and a light-emitting element. The light-emitting element is electrically connected to the first and second connection pads. The signal line is disposed on the first surface. The driving element is electrically connected to the first and third connection pads through the signal line. The transmission line is disposed on the second surface and electrically connected to the second or fourth connection pad at least through the conductive structure. The repair structure is disposed between the transmission line and the conductive structure.

16 Claims, 8 Drawing Sheets

(51) Int. Cl.
*H01L 33/00* (2010.01)
*G09G 3/00* (2006.01)

(58) Field of Classification Search
CPC ...... H01L 25/0753; G09G 3/32; G09G 3/006; G09G 2300/0426; G09G 2330/08; G09F 9/33
See application file for complete search history.

(56) References Cited

U.S. PATENT DOCUMENTS

| | | | |
|---|---|---|---|
| 10,867,875 B2* | 12/2020 | Yen | H01L 25/0753 |
| 11,171,124 B2* | 11/2021 | Lo | H01L 25/0753 |
| 2012/0326177 A1* | 12/2012 | Shirouzu | H01L 27/3265 |
| | | | 438/4 |
| 2015/0115293 A1* | 4/2015 | Wu | H01L 24/24 |
| | | | 438/28 |
| 2017/0186740 A1* | 6/2017 | Cok | H01L 25/167 |
| 2018/0174973 A1* | 6/2018 | Aoyagi | H01L 25/167 |
| 2019/0019436 A1* | 1/2019 | Aoyagi | G09F 9/40 |
| 2019/0181060 A1 | 6/2019 | Pappas et al. | |
| 2020/0168585 A1* | 5/2020 | Lo | H01L 25/0753 |
| 2020/0219779 A1* | 7/2020 | Yen | H01L 25/0753 |
| 2020/0266175 A1* | 8/2020 | Lo | H01L 25/0753 |
| 2021/0082345 A1* | 3/2021 | Lo | G09G 3/3233 |
| 2021/0111162 A1* | 4/2021 | Takeya | H01L 25/0753 |
| 2021/0183309 A1* | 6/2021 | Wu | H01L 33/54 |

\* cited by examiner

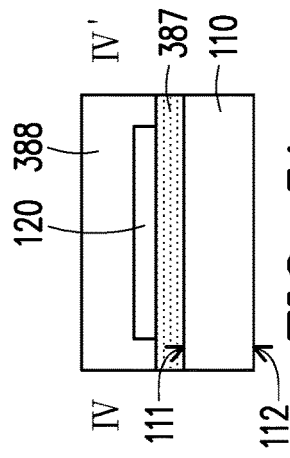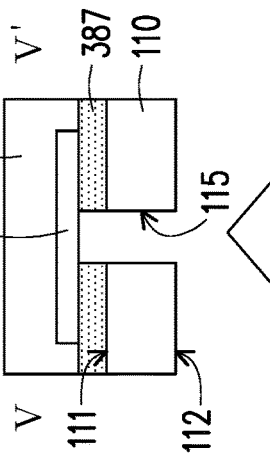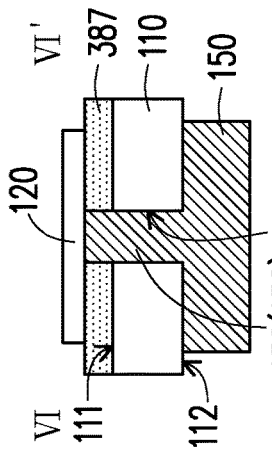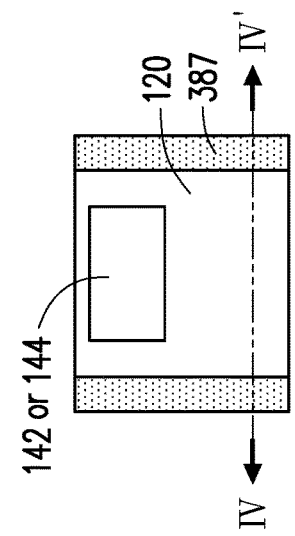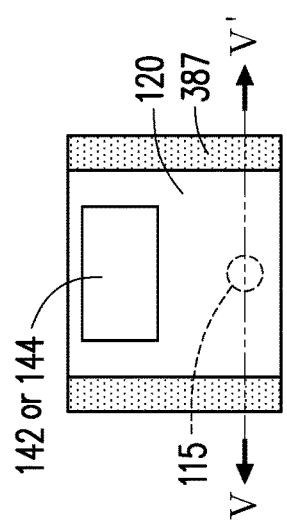

DISPLAY APPARATUS AND MANUFACTURING METHOD THEREOF

CROSS-REFERENCE TO RELATED APPLICATION

This application claims the priority benefits of U.S. provisional application Ser. No. 62/960,846, filed on Jan. 14, 2020 and Taiwan application serial no. 109122232, filed on Jul. 1, 2020. The entirety of each of the above-mentioned patent applications is hereby incorporated by reference herein and made a part of this specification.

BACKGROUND

Technical Field

The invention relates to a display apparatus and a manufacturing method thereof, and particularly relates to a display apparatus having a repair structure and a manufacturing method thereof.

Description of Related Art

In a manufacturing process of a display apparatus, unavoidable defects (such as abnormal bright spots) are often generated. Therefore, how to repair the above-mentioned defects to improve the quality of the display apparatus has become an urgent problem to be solved at present.

SUMMARY

The invention is directed to a display apparatus and a manufacturing method thereof, which achieve a better display effect of the display apparatus.

The invention provides a display apparatus including a substrate, a first conductive structure, a first pixel unit, a first signal line, a transmission line, and a first repair structure. The substrate has a first surface, a second surface opposite to the first surface, and a first through hole penetrating the first surface and the second surface. The first conductive structure is disposed in the first through hole. The first pixel unit is disposed on the first surface of the substrate. The first pixel unit includes a first connection pad, a second connection pad, a third connection pad, a fourth connection pad, a first driving element, and a first light-emitting element. The first light-emitting element is electrically connected to the first connection pad and the second connection pad. The first signal line is disposed on the first surface of the substrate. The first driving element is electrically connected to the first connection pad and the third connection pad through the first signal line. The transmission line is disposed on the second surface of the substrate. The transmission line is electrically connected to the second connection pad or the fourth connection pad at least through the first conductive structure. The first repair structure is disposed between the transmission line and the first conductive structure.

The invention provides a manufacturing method of a display apparatus including following steps. A display structure is provided. The display structure includes a substrate, a first conductive structure, a first pixel unit, a first signal line, a transmission line, and a first repair structure. The substrate has a first surface, a second surface opposite to the first surface, and a first through hole penetrating the first surface and the second surface. The first conductive structure is disposed in the first through hole. The first pixel unit is disposed on the first surface of the substrate. The first pixel unit includes a first connection pad, a second connection pad, a third connection pad, a fourth connection pad, a first driving element, and a first light-emitting element. The first light-emitting element is electrically connected to the first connection pad and the second connection pad. The first signal line is disposed on the first surface of the substrate. The first driving element is electrically connected to the first connection pad and the third connection pad through the first signal line. The transmission line is disposed on the second surface of the substrate. The transmission line is electrically connected to the second connection pad or the fourth connection pad at least through the first conductive structure. The first repair structure is disposed between the transmission line and the first conductive structure. The first light-emitting element of the display structure is tested. After the first light-emitting element is tested, the transmission line is made to be not electrically connected to the second connection pad. A second light-emitting element is disposed on the first surface and electrically connected to the third connection pad and the fourth connection pad.

Based on the above description, in the manufacturing process of the display apparatus, after the first light-emitting element is tested, if it is considered that the first light-emitting element does not have an expected light-emitting state, the second light-emitting element may be configured and the transmission line is made to be not electrically connected to the second connection pad, such that the repaired display apparatus has a good display. Therefore, the display apparatus may have a better display effect.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4A to FIG. 4C are schematic top views of a part of a method for forming a conductive structure according to another embodiment of the invention.

FIG. 5A to FIG. 5C are schematic cross-sectional views of a part of a method for forming a conductive structure according to another embodiment of the invention.

DESCRIPTION OF THE EMBODIMENTS

Figure 1A:
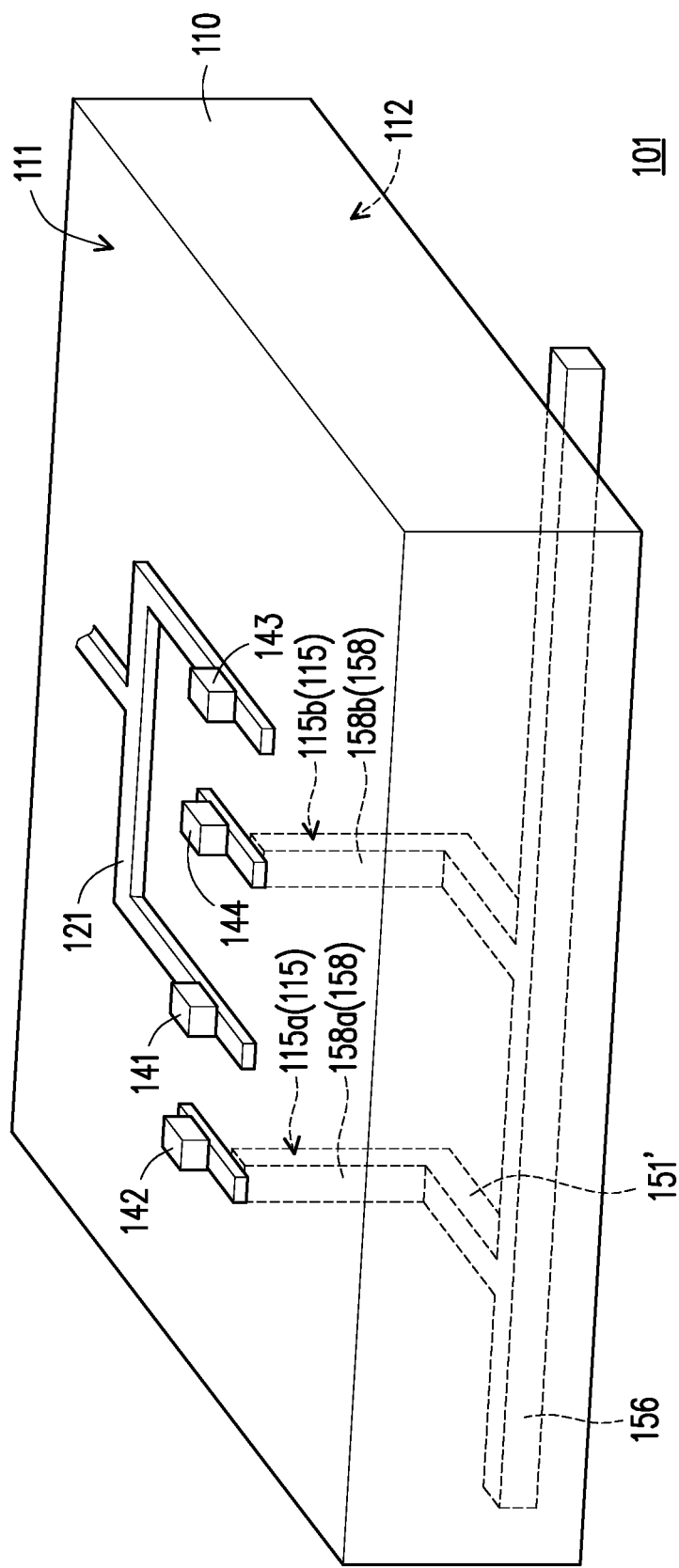
FIG. 1A is a partial schematic three-dimensional view of a part of a manufacturing method of a display apparatus according to a first embodiment of the invention.

Reference will now be made in detail to the present preferred embodiments of the invention, examples of which are illustrated in the accompanying drawings. As those skilled in the art would realize, the described embodiments may be modified in various different ways without departing from the spirit or scope of the invention.

In the drawings, a thickness or a size of each element, etc., is exaggerated for clarity's sake. Throughout the specification, the same reference numerals denote the same elements. It should be understood that when an element such as a layer, a film, a region, or a substrate is referred to as being "on another element", or "connected to another element", or "overlapped with another element", it may be directly on the another element or connected to the another element, or intermediate elements may exist there between. Conversely, when an element is referred to as being "directly on another element" or "directly connected to another element", there is no intermediate element. As used herein, "connected" may refer to physical and/or electrical connections.

It should be understood that although the terms "first", "second", "third", etc., may be used to describe various elements, components, regions, layers and/or portions, these elements, components, regions, and/or portions are not restricted by these terms. These terms are only used to distinguish one element, component, region, layer or portion from another element, component, region, layer or portion. Therefore, the "first element", "component," "region," "layer," or "portion" discussed below may be referred to as a second element, component, region, layer or portion without departing from the teachings of the specification.

The terminology used herein is for the purpose of describing particular embodiments and is not intended to be limiting of the invention. As used herein, the singular forms "a," "an" and "the" are intended to include the plural forms as well, unless the context clearly indicates otherwise. "or" represents "and/or". The term "and/or" used herein includes any or a combination of one or more of the associated listed items. It will be further understood that the terms "comprises," "comprising," "includes" and/or "including," when used herein, specify the presence of stated features, regions, integers, steps, operations, elements, and/or components, but do not preclude the presence or addition of one or more other features, regions, integers, steps, operations, elements, components, and/or groups thereof.

In addition, relative terms such as "under" or "bottom" and "above" or "top" may be used for describing a relationship of one element and another element as that shown in the figures. It should be noted that the relative terms are intended to include a different orientation of the apparatus besides the orientation shown in the figure. For example, if an apparatus in a figure is flipped over, the element originally described to be disposed "under" other element is oriented to be disposed "above" the other element. Therefore, the illustrative term "under" may include orientations of "under" and "on", which is determined by the specific orientation of the figure. Similarly, if an apparatus in a figure is flipped over, the element originally described to be disposed "below" or "underneath" other element is oriented to be disposed "on" the other element. Therefore, the illustrative term "under" or "below" may include orientations of "above" and "under".

The term "substantial" used herein include the related value and an average within an acceptable deviation range for a specific value determined by those skilled in the art, considering a discussed measurement and a specific number of errors related to the measurement (i.e. a limitation of a measuring system). For example, "substantial" may represent a range within one or a plurality of standard deviations of the related value, or within ±30%, ±20%, ±10%, ±5%.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The exemplary embodiment is described below with reference of a cross-sectional view of a schematic diagram of an idealized embodiment. Therefore, a shape change of the figure serving as a result of manufacturing techniques and/or tolerances may be expected. Therefore, the embodiment of the invention should not be construed as limited to a particular shape of a region as shown herein, but includes a shape deviation caused by manufacturing tolerance. For example, a shown or described flat area may generally have rough and/or non-linear features. Moreover, a shown acute angle may be round. Therefore, a region shown in the figure is essentially schematic, and a shape thereof is not intended to show an accurate shape of the region, and is not intended to limit a range of the claims of the invention.

FIG. 1A to FIG. 1E are partial schematic three-dimensional views or partial schematic top views of a part of a manufacturing method of a display apparatus according to a first embodiment of the invention. For example, a display structure in FIG. 1B may correspond to be a partial schematic top view of the display structure in FIG. 1A, and the display apparatus in FIG. 1E may correspond to a partial schematic top view of the display structure in FIG. 1D. In addition, for clarity's sake, some of film layers or components may be omitted in FIG. 1A to FIG. 1E.

Figure 1B:
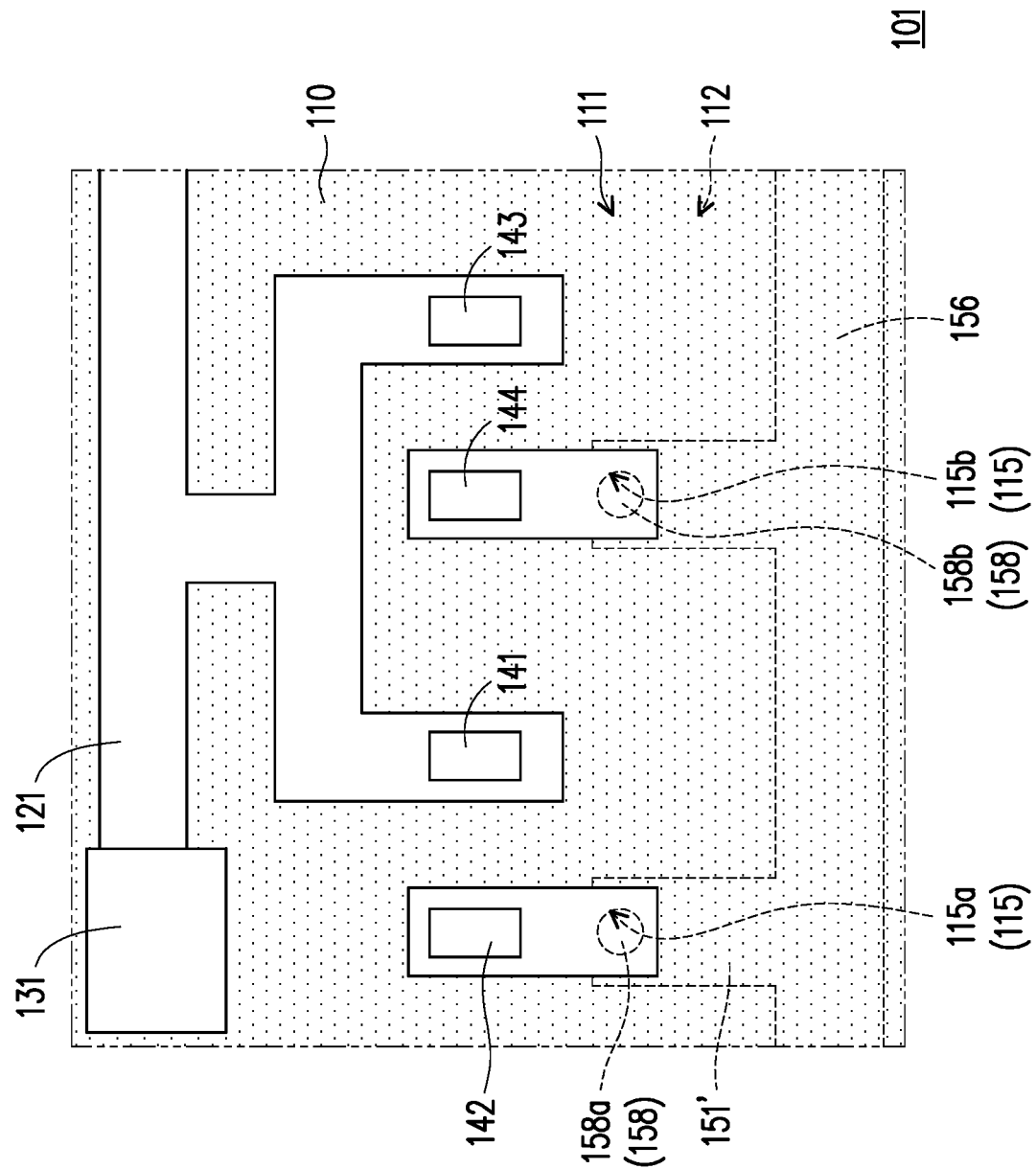
FIG. 1B is partial schematic top view of a part of the manufacturing method of the display apparatus according to the first embodiment of the invention.

Referring to FIG. 1A and FIG. 1B, a substrate structure 101 is provided. The substrate structure 101 may include a substrate 110, at least one conductive structure 158, a first connection pad 141, a second connection pad 142, a third connection pad 143, a fourth connection pad 144, a first signal line 121, a first driving element 131, a transmission line 156 and a first repair structure 151'. The substrate 110 has a first surface 111, a second surface 112 and at least one through hole 115. The second surface 112 is opposite to the first surface 111. The aforementioned through hole 115 penetrates through the first surface 111 and the second surface 112. The conductive structure 158 is disposed in the corresponding through hole 115. The first connection pad 141, the second connection pad 142, the third connection pad 143, the fourth connection pad 144, the first signal line 121 and the first driving element 131 are disposed on the first surface 111 of the substrate 110. The first driving element 131 is electrically connected to the first connection pad 141 and the third connection pad 143 through the first signal line 121. The transmission line 156 is disposed on the second surface 112 of the substrate 110. The transmission line 156 is electrically connected to the second connection pad 142 or the fourth connection pad 144 at least through the conductive structure 158. The first repair structure 151' is disposed between the transmission line 156 and at least one of the conductive structures 158.

For example, the conductive structures 158 may include a first conductive structure 158a and a second conductive structure 158b, and the through holes 115 may include a first through hole 115a and a second through hole 115b. The first conductive structure 158a is disposed in the first through hole 115a. The second conductive structure 158b is disposed in the second through hole 115b. The transmission line 156 may be electrically connected to the fourth connection pad 144 through the second conductive structure 158b.

In the structure of FIG. 1A and FIG. 1B, the first repair structure 151' is disposed between the transmission line 156 and the first conductive structure 158a, and a conductor in the first repair structure 151' is a continuous structure. Namely, in the structure of FIG. 1A and FIG. 1B, the transmission line 156 may be electrically connected to the second connection pad 142 through the first conductive structure 158a.

In an embodiment, the first driving element 131 may be a thin film transistor (TFT), but the invention is not limited thereto. For example, the first driving element 131 may be a TFT including a source, a drain, and a gate. The drain of the first driving element 131 may be electrically connected to the first connection pad 141 and the third connection pad 143 through the first signal line 121. The aforementioned TFT may be a top gate TFT, a bottom gate TFT or a dual gate TFT.

In an embodiment, the first driving element 131 may be a driving chiplet, but the invention is not limited thereto.

In an embodiment, a method for forming a conductive structure 358 (one of the conductive structures 158) may be as follows.

Figure 3A:
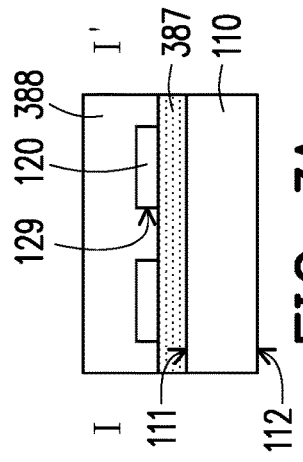
FIG. 3A to FIG. 3C are schematic cross-sectional views of a part of a method for forming a conductive structure according to an embodiment of the invention.
Figure 3B:
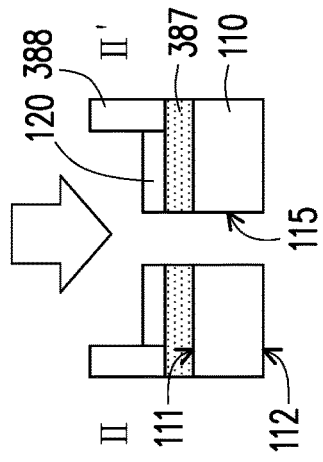
Figure 3C:
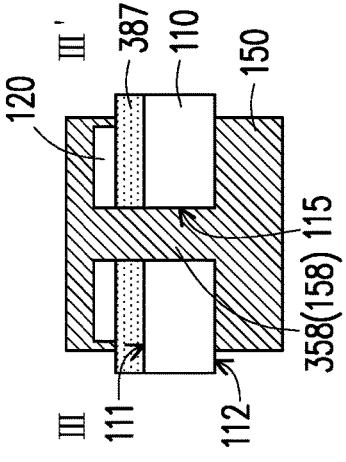

Referring to FIG. 2A to FIG. 2C and FIG. 3A to FIG. 3C, FIG. 2A to FIG. 2C are schematic top views of a part of a method for forming a conductive structure according to an embodiment of the invention, and FIG. 3A to FIG. 3C are schematic cross-sectional views of a part of a method for forming a conductive structure according to an embodiment of the invention. For example, FIG. 3A may be a schematic cross-sectional view corresponding to a section line I-I' in FIG. 2A, FIG. 3B may be a schematic cross-sectional view corresponding to a section II-II' in FIG. 2B, and/or FIG. 3C may be a schematic cross-sectional view corresponding to a section III-III' in FIG. 2C.

Figure 2A:
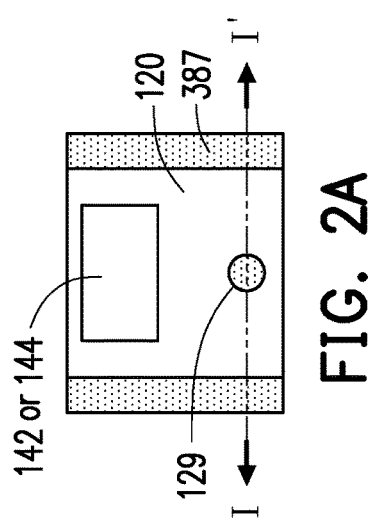
FIG. 2A to FIG. 2C are schematic top views of a part of a method for forming a conductive structure according to an embodiment of the invention.
Figure 2B:
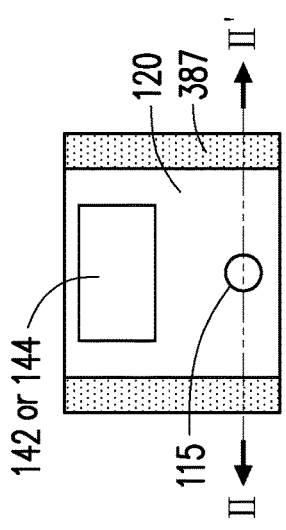
Figure 2C:
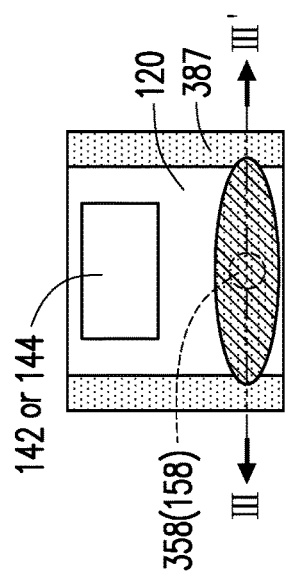

Referring to FIG. 2A and FIG. 3A, in an embodiment, a first patterned conductive layer 120 may be formed on the first surface 111 of the substrate 110. A part of patterned lines in the first patterned conductive layer 120 may constitute a part of the first signal line 121.

In an embodiment, the first patterned conductive layer 120 may have an opening 129.

In an embodiment, the first patterned conductive layer 120 may be formed by sputtering.

In an embodiment, an insulating layer 387 may be provided between the first patterned conductive layer 120 and the substrate 110. In an embodiment, the insulating layer 387 may be referred to as a buffer layer, but the invention is not limited thereto.

In an embodiment, a protective layer 388 may be provided on the first surface 111 of the substrate 110. The protective layer 388 may include an insulating layer or an insulating film formed by plating, coating, pasting or other suitable methods. In this way, in a subsequent removal step (for example, when a part of a film layer or component is removed by laser burning), it may probably reduce a chance that conductive flying debris or conductive particles directly adhere to the first patterned conductive layer 120 (or the first signal line 121).

Referring to FIG. 2A to FIG. 2B and FIG. 3A to FIG. 3B, at least one through hole 115 is formed on the substrate 110. For example, a laser burning method may be used to form the through hole 115 on the first surface 111 of the substrate 110 that penetrates through the substrate 110 from the first surface 111 to the second surface 112. The through hole 115 may correspond to the opening 129 of the first patterned conductive layer 120. In addition, based on the aforementioned method, an opening corresponding to the through hole 115 may be formed on the protective layer 388, and/or an opening corresponding to the through hole 115 may be formed on the insulating layer 387.

Referring to FIG. 2B to FIG. 2C and FIG. 3B to FIG. 3C, after at least one through hole 115 is formed on the substrate 110, a second patterned conductive layer 150 may be formed on the second surface 112 of the substrate 110. A part of patterned lines in the second patterned conductive layer 150 may constitute a part of the first repair structure 151' and/or a part of the transmission line 156. In addition, a part of a conductive material used to form the second patterned conductive layer 150 may be further filled into the through hole 115 (for example, the first through hole 115a or the second through hole 115b) to form the conductive structure 358 (one of the conductive structures 158; for example, the first conductive structure 158a or the second conductive structure 158b).

In an embodiment, a seed layer may be formed on the second surface 112 of the substrate 110, and then an electroplated layer is plated on the seed layer by electroplating. Furthermore, a patterning step is performed on the seed layer, and after the patterning step is performed on the seed layer, the patterned seed layer and the patterned electroplated layer may construct the second patterned conductive layer 150.

In an embodiment, before the second patterned conductive layer 150 is formed, a part of the protective layer 388 may be removed.

In an embodiment, the conductive material filled in the through hole 115 may further cover the first surface 111 of the substrate 110 and may cover a part of the first patterned conductive layer.

In another embodiment, a method for forming a conductive structure 458 (one of the conductive structures 158) may be as follows.

Referring to FIG. 4A to FIG. 4C and FIG. 5A to FIG. 5C, FIG. 4A to FIG. 4C are schematic top views of a part of a method for forming a conductive structure according to another embodiment of the invention, and FIG. 5A to FIG. 5C are schematic cross-sectional views of a part of a method for forming a conductive structure according to another embodiment of the invention. For example, FIG. 5A may be a schematic cross-sectional view corresponding to a section line IV-IV' in FIG. 4A, FIG. 5B may be a schematic cross-sectional view corresponding to a section V-V' in FIG. 4B, and/or FIG. 5C may be a schematic cross-sectional view corresponding to a section VI-VI' in FIG. 4C. In addition, the method for forming the conductive structure 458 of the embodiment is similar to the method for forming the conductive structure 358 of the aforementioned embodiment, and similar components are denoted by the same reference numerals, and have similar functions, materials, formation methods or configurations, and descriptions thereof are omitted.

Referring to FIG. 4A and FIG. 5A, in an embodiment, the first patterned conductive layer 120 may be formed on the first surface 111 of the substrate 110. A part of patterned lines in the first patterned conductive layer 120 may constitute a part of the first signal line 121.

Referring to FIG. 4A to FIG. 4B and FIG. 5A to FIG. 5B, at least one through hole 115 is formed on the substrate 110. For example, a laser burning method may be used to form the through hole 115 on the second surface 112 of the substrate 110 that penetrates through the substrate 110 from the second surface 112 to the first surface 111. The through hole 115 may expose a part of the first patterned conductive layer 120. In addition, based on the aforementioned method, an opening corresponding to the through hole 115 may be formed on the insulating layer 387.

Referring to FIG. 4B to FIG. 4C and FIG. 5B to FIG. 5C, after the at least one through hole 115 is formed on the substrate 110, the second patterned conductive layer 150 may be formed on the second surface 112 of the substrate 110. A part of patterned lines in the second patterned conductive layer 150 may constitute a part of the first repair structure 151' and/or a part of the transmission line 156. In addition, a part of the conductive material used to form the second patterned conductive layer 150 may be further filled into the through hole 115 (for example, the first through hole 115a or the second through hole 115b) to form the conductive structure 458 (one of the conductive structures 158; for example, the first conductive structure 158a or the second conductive structure 158b).

Figure 1C:
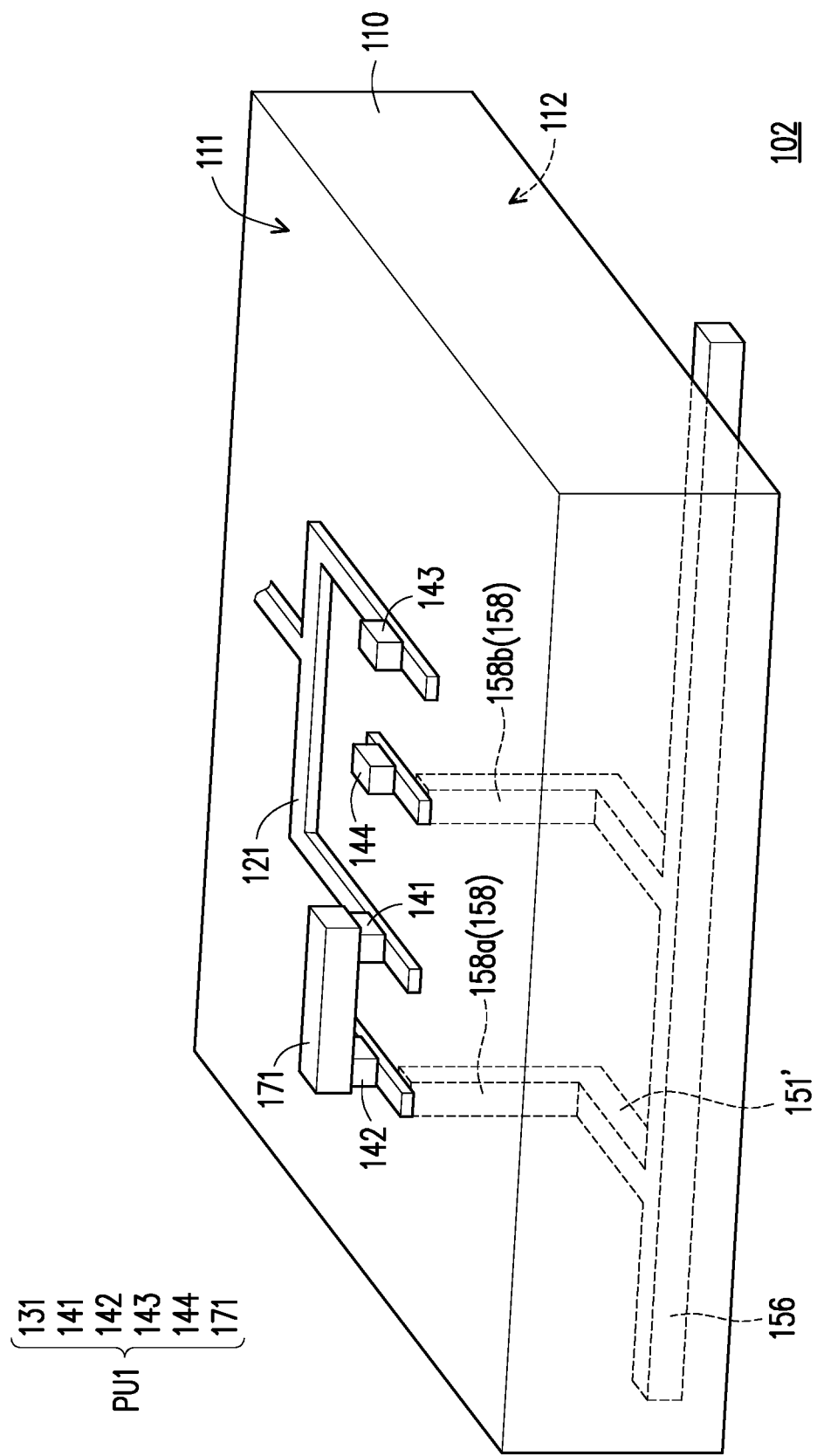
FIG. 1C is a partial schematic three-dimensional view of a part of the manufacturing method of the display apparatus according to the first embodiment of the invention.

Referring to FIG. 1C, a first light-emitting element 171 is disposed on the first surface 111 of the substrate 110, and the two electrodes (such as an anode and a cathode) of the first light-emitting element 171 may be electrically connected to the first connection pad 141 and the second connection pad 142, respectively.

In the embodiment, the first light-emitting element 171 may be a semiconductor die, and it is not limited that the first light-emitting element 171 disposed on the substrate 110 needs to be a known good die (KGD).

In the embodiment, the substrate structure 101 and the first light-emitting element 171 disposed thereon may be referred to as a display structure 102. The first connection pad 141, the second connection pad 142, the third connection pad 143, the fourth connection pad 144, the first driving element 131 and the first light-emitting element 171 may constitute a first pixel unit PU1 of the display structure 102.

In the embodiment, the first light-emitting element 171 of the display structure 102 may be tested to confirm whether the first light-emitting element 171 of the first pixel unit PU1 may have an expected light-emitting state. For example, a common bright point defect test may be performed on the first light-emitting element 171 of the display structure 102.

Figure 1D:
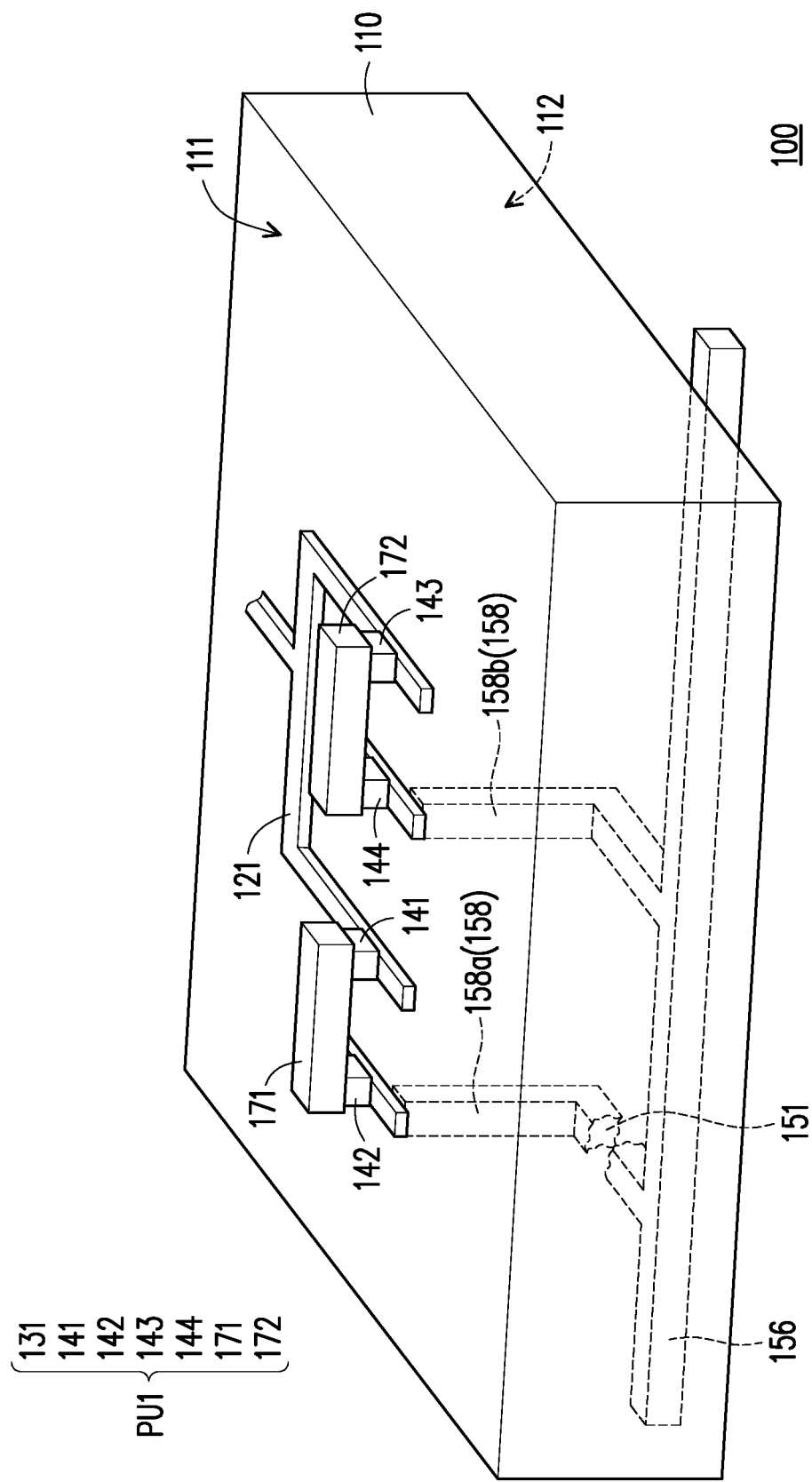
FIG. 1D is a partial schematic three-dimensional view of a part of the manufacturing method of the display apparatus according to the first embodiment of the invention.
Figure 1E:
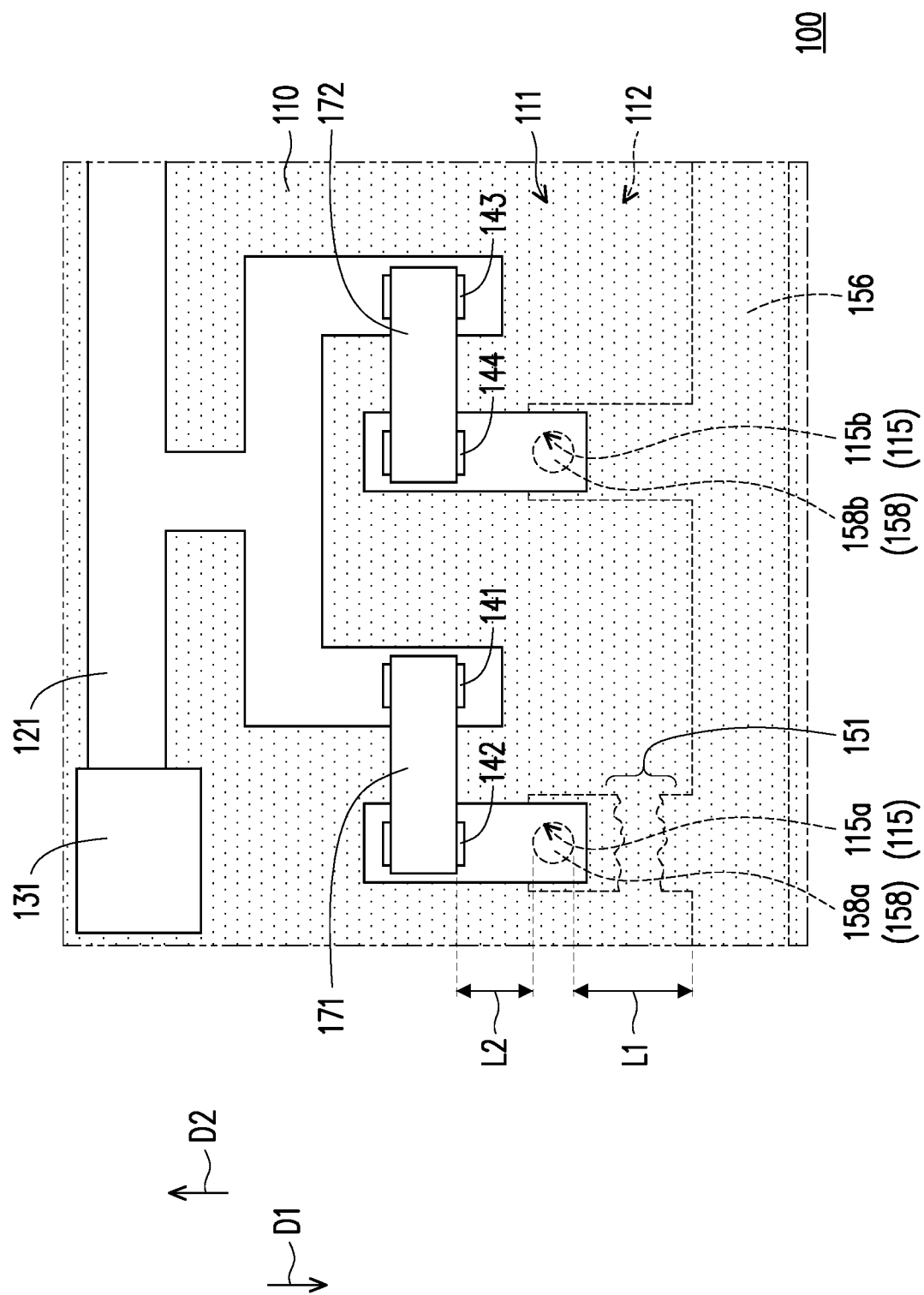
FIG. 1E is partial schematic top view of a part of the manufacturing method of the display apparatus according to the first embodiment of the invention.

Referring to FIG. 1C to FIG. 1D and FIG. 1E. After the first light-emitting element 171 shown in FIG. 1C is tested, if it is determined that the first light-emitting element 171 does not have the expected light-emitting state, the transmission line 156 is not electrically connected to the second connection pad 142 as shown in FIG. 1D. For example, after performing the bright point defect test on the first light-emitting element 171 as shown in FIG. 1C, if the first light-emitting element 171 is determined to be an abnormal bright point defect, the transmission line 156 is made to be not electrically connected to the second connection pad 142 as shown in FIG. 1D.

In the embodiment, by removing a part of the conductor of the first repair structure 151' shown in FIG. 1C, the first repair structure 151 shown in FIG. 1D or FIG. 1E is opened. Namely, the conductor in the first repair structure 151 shown in FIG. 1D and FIG. 1E is a discontinuous structure, i.e., an open circuit.

In the embodiment, a part of the conductor of the first repair structure 151' shown in FIG. 1C may be removed by laser burning.

In the embodiment, since the first repair structure (which may include the first repair structure 151' or the first repair structure 151) is disposed on the second surface 112 of the substrate 110, if a part of the conductor of the first repair structure 151' shown in FIG. 1C is removed by laser burning, it probably reduces a chance of damaging the film layer or elements (such as the first connection pad 141, the second connection pad 142, the third connection pad 143, the fourth connection pad 144, the first driving element 131, the first light-emitting element 171 or the first signal line 121, but the invention is not limited thereto) on the first surface 111 of the substrate 110.

In the embodiment, in a direction perpendicular to the first surface 111 or the second surface 112, the first repair structure 151 is not overlapped with the first connection pad 141, the second connection pad 142, the first driving element 131 and the first light-emitting element 171. For example, similar to that shown in FIG. 1B, a projection of the first repair structure 151 on the first surface 111/the second surface 112 may be completely not overlapped with projections of the first connection pad 141, the second connection pad 142, the first driving element 131 and the first light-emitting element 171 on the first surface 111/the second surface 112. In this way, if a part of the conductor of the first repair structure 151' shown in FIG. 1C is removed by laser burning, it may probably reduce a chance of damaging the first connection pad 141, the second connection pad 142, the first driving element 131 and the first light-emitting element 171.

In the embodiment, the first repair structure 151 extends from the first conductive structure 158a in a first direction D1, the first signal line 121 extends from the first connection pad 141 in a second direction D2, and the first direction D1 is different from the second direction D2. In this way, if a part of the conductor of the first repair structure 151' shown in FIG. 1C is removed by laser burning, it may probably reduce a chance of damaging the first signal line 121.

In the embodiment, in a direction perpendicular to the first surface 111 or the second surface 112, the first repair structure 151 may be not overlapped with the first signal line 121. For example, similar to that shown in FIG. 1B, a projection of the first repair structure 151 on the first surface 111/the second surface 112 may be completely not overlapped with a projection of the first signal line 121 on the first surface 111/the second surface 112.

Referring to FIG. 1C to FIGS. 1D and 1E, after the first light-emitting element 171 shown in FIG. 1C is tested, if it is determined that the first light-emitting element 171 does not have the expected light-emitting state, a second light-emitting element 172 is arranged on the first surface 111 of the substrate 110 as shown in FIG. 1D or FIG. 1E, and two electrodes (such as an anode and a cathode) of the second light-emitting element 172 may be electrically connected to the third connection pad 143 and the fourth connection pad 144, respectively.

In the embodiment, the second light-emitting element 172 may be disposed on the first surface 111 of the substrate 110 after the first repair structure 151 of the open circuit is formed. In an embodiment, the first repair structure 151 of the open circuit may be formed after the second light-emitting element 172 is disposed on the first surface 111 of the substrate 110.

In the embodiment, a light-emitting color of the second light-emitting element 172 is substantially the same as an expected light-emitting color of the first light-emitting element 171. In one embodiment, the structure of the second light-emitting element 172 is substantially the same as the structure of the first light-emitting element 171. For example, the second light-emitting element 172 and the first light-emitting element 171 may include semiconductor light-emitting diode elements having a film layer with a same doping element and/or doping concentration.

After performing the above-mentioned manufacturing steps, manufacturing of a display apparatus 100 of the embodiment can be substantially completed.

FIG. 1D and FIG. 1E, the display apparatus 100 includes the substrate 110, the first conductive structure 158a, the first pixel unit PU1, the first signal line 121, the transmission line 156, and the first repair structure 151. The first pixel unit PU1 is disposed on the first surface 111 of the substrate 110. The first pixel unit PU1 includes the first connection pad 141, the second connection pad 142, the third connection pad 143, the fourth connection pad 144, the first driving element 131 and the first light-emitting element 171. The first repair structure 151 is disposed between the transmission line 156 and the first conductive structure 158a.

In the embodiment, the first repair structure 151 may be an open circuit. In other words, the transmission line 156 and the first conductive structure 158a may be electrically insulated.

In the embodiment, the first pixel unit PU1 may further include the second light-emitting element 172. In an embodiment, during the manufacturing process of the display apparatus 100, after the first light-emitting element 171 is tested, if it is determined that the first light-emitting element 171 does not have the expected light-emitting state (such as a bright spot), by configuring the second light-emitting element 172 and not electrically connecting the transmission line 156 to the second connection pad 142 (for example, the first repair structure 151 is opened), the repaired display apparatus 100 may have a good display. In this way, the display apparatus 100 may have a better display effect.

In an embodiment, in a horizontal direction parallel to the first surface 111 or the second surface 112, there is a first distance L1 between the first conductive structure 158a and the transmission line 156, and there is a second distance between the first conductive structure 158a and the first light-emitting element 171, and the first distance L1 is greater than the second distance L2. In this way, if a part of the conductor of the first repair structure 151' as shown in FIG. 1C is removed by laser burning, it may probably reduce a chance of damaging the first conductive structure 158a or the first light-emitting element 171.

In an embodiment, the first distance L1 may be greater than or equal to 1 micrometer (μm) and less than or equal to 30 μm, but the invention is not limited thereto.

In an embodiment, after the first light-emitting element 171 shown in FIG. 1C is tested, if it is determined that the first light-emitting element 171 has the expected light-emitting state, the display structure 102 shown in FIG. 1C may still be referred to as a display apparatus. In an embodiment, if the first light-emitting element 171 shown in FIG. 1C has the expected light-emitting state, the third connection pad 143 and the fourth connection pad 144 may not be configured with a light-emitting element (for example: a light-emitting element that is the same or similar to the second light-emitting element 172) thereon. Namely, in an embodiment, the display apparatus may have a first state (for example, referred to as a state of the display structure 102 of the display apparatus) or a second state (for example, a state of the display apparatus 100), where a difference between the first state and the second state is that in the state, the transmission line 156 is electrically connected to the second connection pad 142, and the third connection pad 143 and the fourth connection pad 144 are not configured with the light-emitting element thereon; and in the second state, the transmission line 156 is not electrically connected to the second connection pad 142, and the third connection pad 143 and the fourth connection pad 144 are configured with the second light emitting element 172 thereon.

Figure 6:
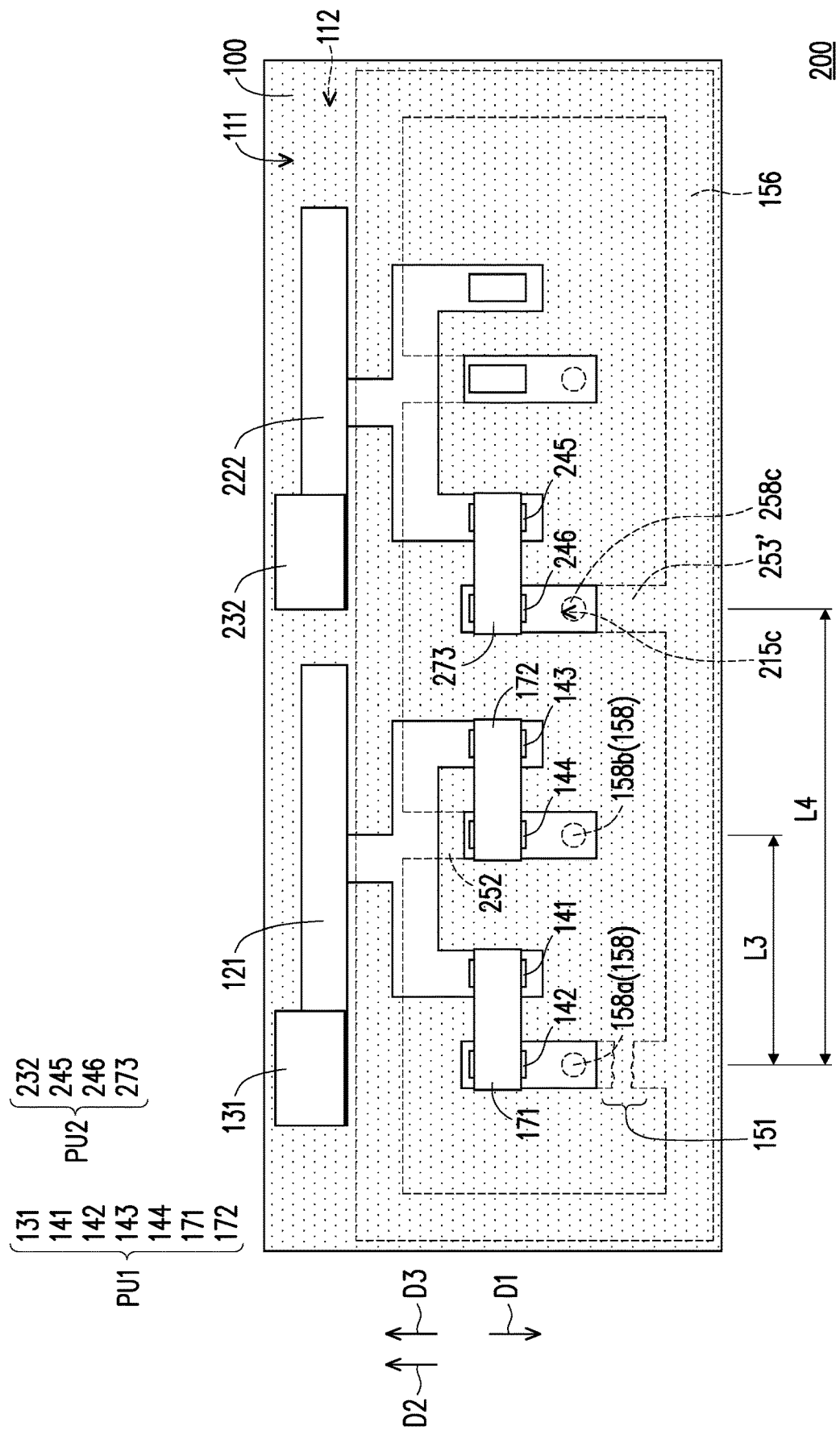
FIG. 6 is a partial schematic top view of a display apparatus according to a second embodiment of the invention.

FIG. 6 is a partial schematic top view of a display apparatus according to a second embodiment of the invention. A display apparatus 200 of the embodiment is similar to the display apparatus 100 of the first embodiment, where the similar components are denoted by the same referential numbers, and have similar functions, materials, forming methods or configuration modes, and descriptions thereof are omitted.

Referring to FIG. 6, in an embodiment, the display apparatus 200 may include the substrate 110, the first conductive structure 158a, the first pixel unit PU1, the first signal line 121, the transmission line 156, the first repair structure 151, a first connection line 252, and the second conductive structure 158b. The first connection line 252 is disposed on the second surface 112 of the substrate 110 and is electrically connected to the transmission line 156. The fourth connection pad 144 is electrically connected to the transmission line 156 through the second conductive structure 158b and the first connection line 252. The first repair structure 151 extends from the first conductive structure 158a in the first direction D1, the first connection line 252 extends from the second conductive structure 158b in a third direction D3, and the first direction D1 is different from the third direction D3. In this way, when a part of the conductor of the first repair structure 151' shown in FIG. 1C is removed by laser burning, it probably reduces a chance of damaging the first connection line 252.

In an embodiment, the first connection line 252 can be formed in the same or similar manner as that of the transmission line 156, but the invention is not limited thereto.

In an embodiment, the second direction D2 may be the same or similar to the third direction D3, but the invention is not limited thereto.

Referring to FIG. 6, in an embodiment, the display apparatus 200 may include the substrate 110, the first conductive structure 158a, the first pixel unit PU1, the first signal line 121, the transmission line 156, the first repair structure 151, and a second pixel unit PU2. The second pixel unit PU2 is disposed on the first surface 111 of the substrate 110. The second pixel unit PU2 includes a fifth connection pad 245, a sixth connection pad 246, a second driving element 232, and a third light-emitting element 273. The third light-emitting element 273 is electrically connected to the fifth connection pad 245 and the sixth connection pad 246. The second driving element 232 is electrically connected to the fifth connection pad 245. The transmission line 156 is electrically connected to the sixth connection pad 246.

In an embodiment, two electrodes (for example, an anode and a cathode) of the third light-emitting element 273 may be electrically connected to the fifth connection pad 245 and the sixth connection pad 246, respectively.

In an embodiment, a light-emitting color of the third light-emitting element 273 is different from the expected light-emitting color of the first light-emitting element 171 or the expected light-emitting color of the second light-emitting element 172.

In an embodiment, the second driving element 232 may be similar to the first driving element 131. For example, the second driving element 232 may be a thin film transistor including a source, a drain, and a gate, and the drain of the second driving element 232 may be electrically connected to the fifth connection pad 245 through the second signal line 222.

In an embodiment, the display apparatus 200 may further include the first connection line 252, a second repair structure 253', and a third conductive structure 258c. The substrate 110 further has a third through hole 215c penetrating the first surface 111 and the second surface 112. The third conductive structure 258c is disposed in the third through hole 215c and is electrically connected to the fifth connection pad 245 and the second repair structure 253'. The second repair structure 253' is disposed between the transmission line 156 and the third conductive structure 258c. A part of the first connection line 252 is not disposed on a connection line of the first repair structure 151 and the second repair structure 253'. For example, a connection line connecting any part of the first repairing structure 151 and any part of the second repairing structure 253' is not intersected with a part of the first connection line 252. In this way, when a part of the conductor of the first repair structure 151' shown in FIG. 1C is removed by laser burning, and/or when a part of a conductor of the second repair structure 253' is required to be removed by laser burning, it probably reduces a chance of damaging the first connection line 252.

In an embodiment, there is a third distance L3 between the second conductive structure 158b and the first conductive structure 158a, and there is a fourth distance L4 between the third conductive structure 258c and the first conductive structure 158a, and the fourth distance L4 is greater than the third distance L3. In this way, when a part of the conductor of the first repair structure 151' shown in FIG. 1C is removed by laser burning, and/or when a part of the conductor of the second repair structure 253' is required to be removed by laser burning, it probably reduces a chance of damaging the first connection line 252. In this way, the display apparatus 200 may have a better display effect.

In an embodiment, the third distance L3 may be greater than or equal to 10 μm and less than or equal to 85 μm, but the invention is not limited thereto.

In the aforementioned embodiments, the conductive layer may be a single layer or a multi-layer structure. In case of the conductive layer with a multi-layer structure, the aforementioned multi-layer structure may not have an insulating material.

In the aforementioned embodiments, the insulating layer may have a single layer or multilayer structure. In case of the insulating layer with a multi-layer structure, the aforementioned multi-layer structure may not have a conductive material.

In summary, in the manufacturing process of the display apparatus of the invention, after the first light-emitting element is tested, if it is considered that the first light-emitting element does not have an expected light-emitting state, the second light-emitting element may be configured and the transmission line is made to be not electrically connected to the second connection pad, such that the repaired display apparatus has a good display. Therefore, the display apparatus may have a better display effect.

What is claimed is:

1. A display apparatus, comprising:
    a substrate, having a first surface, a second surface opposite to the first surface, and a first through hole penetrating the first surface and the second surface;
    a first conductive structure, disposed in the first through hole;
    a first pixel unit, disposed on the first surface of the substrate and comprising a first connection pad, a second connection pad, a third connection pad, a fourth connection pad, a first driving element, and a first light-emitting element, wherein the first light-emitting element is electrically connected to the first connection pad and the second connection pad;
    a first signal line, disposed on the first surface of the substrate, and the first driving element being electrically connected to the first connection pad and the third connection pad through the first signal line;
    a transmission line, disposed on the second surface of the substrate and electrically connected to the second connection pad or the fourth connection pad at least through the first conductive structure; and
    a first repair structure, disposed between the transmission line and the first conductive structure.

2. The display apparatus as claimed in claim 1, wherein the first repair structure is a closed circuit.

3. The display apparatus as claimed in claim 1, wherein the first repair structure is an open circuit, and the first pixel unit further comprises:
    a second light-emitting element, electrically connected to the third connection pad and the fourth connection pad.

4. The display apparatus as claimed in claim 3, wherein a light-emitting color of the first light-emitting element is substantially the same as a light-emitting color of the second light-emitting element.

5. The display apparatus as claimed in claim 1, wherein in a direction perpendicular to the first surface or the second surface, the first repair structure is not overlapped with the first connection pad, the second connection pad, the first driving element, and the first light-emitting element.

6. The display apparatus as claimed in claim 1, wherein the first repair structure extends from the first conductive structure towards a first direction, the first signal line extends from the first connection pad towards a second direction, and the first direction is different from the second direction.

7. The display apparatus as claimed in claim 1, wherein in a horizontal direction parallel to the first surface or the second surface, there is a first distance between the first conductive structure and the transmission line, there is a second distance between the first conductive structure and the first light-emitting element, and the first distance is greater than the second distance.

8. The display apparatus as claimed in claim 1, wherein the substrate further has a second through hole penetrating the first surface and the second surface, the display apparatus further comprising:
    a first connection line, disposed on the second surface of the substrate and electrically connected to the transmission line; and
    a second conductive structure, disposed in the second through hole and electrically connected to the third connection pad and the first connection line, wherein the first repair structure extends from the first conductive structure towards a first direction, the first connection line extends from the second conductive structure towards a third direction, and the first direction is different from the third direction.

9. The display apparatus as claimed in claim 1, further comprising:
    a second pixel unit, disposed on the first surface of the substrate and comprising a fifth connection pad, a sixth connection pad, a second driving element, and a third light-emitting element, wherein the third light-emitting element is electrically connected to the fifth connection pad and the sixth connection pad, the second driving element is electrically connected to the fifth connection pad, and the transmission line is electrically connected to the sixth connection pad.

10. The display apparatus as claimed in claim 9, wherein a light-emitting color of the first light-emitting element is different from a light-emitting color of the third light-emitting element.

11. The display apparatus as claimed in claim 9, wherein the substrate further has a second through hole and a third through hole penetrating the first surface and the second surface, the display apparatus further comprising:
 a first connection line, disposed on the second surface of the substrate and electrically connected to the transmission line;
 a second conductive structure, disposed in the second through hole and electrically connected to the fourth connection pad and the first connection line;
 a third conductive structure, disposed in the third through hole and electrically connected to the fifth connection pad; and
 a second repair structure, disposed between the transmission line and the third conductive structure, wherein a part of the first connection line is not disposed on a connection line of the first repair structure and the second repair structure.

12. The display apparatus as claimed in claim 9, wherein there is a third distance between the second conductive structure and the first conductive structure, there is a fourth distance between the third conductive structure and the first conductive structure, and the fourth distance is greater than the third distance.

13. A manufacturing method of a display apparatus, comprising:
 providing a display structure, comprising;
  a substrate, having a first surface, a second surface opposite to the first surface, and a first through hole penetrating the first surface and the second surface;
  a first conductive structure, disposed in the first through hole;
  a first pixel unit, disposed on the first surface of the substrate and comprising a first connection pad, a second connection pad, a third connection pad, a fourth connection pad, a first driving element, and a first light-emitting element, wherein the first light-emitting element is electrically connected to the first connection pad and the second connection pad;
  a first signal line, disposed on the first surface of the substrate, and the first driving element being electrically connected to the first connection pad and the third connection pad through the first signal line;
  a transmission line, disposed on the second surface of the substrate and electrically connected to the second connection pad or the fourth connection pad at least through the first conductive structure; and
  a first repair structure, disposed between the transmission line and the first conductive structure;
 testing the first light-emitting element of the display structure;
 making the transmission line to be not electrically connected to the second connection pad after testing the first light-emitting element; and
 disposing a second light-emitting element on the first surface to be electrically connected to the third connection pad and the fourth connection pad.

14. The manufacturing method of the display apparatus as claimed in claim 13, wherein before making the transmission line to be not electrically connected to the second connection pad, a protective layer is formed on the first surface of the substrate.

15. The manufacturing method of the display apparatus as claimed in claim 13, wherein before testing the first light-emitting element, the first repair structure is a closed circuit, and the step of making the transmission line to be not electrically connected to the second connection pad comprises:
 removing a part of the first repair structure, so that the first repair structure is an open circuit.

16. The manufacturing method of the display apparatus as claimed in claim 15, wherein the step of removing the part of the first repair structure comprises laser burning.

* * * * *